(12) United States Patent
Godet et al.

(10) Patent No.: US 10,889,266 B2
(45) Date of Patent: Jan. 12, 2021

(54) METHOD AND SYSTEM FOR DETECTING THE PRESENCE OF A HUMAN HAND ON A MOTOR VEHICLE OPENING ELEMENT

(71) Applicants: Continental Automotive France, Toulouse (FR); Continental Automotive GmbH, Hannover (DE)

(72) Inventors: Sylvain Godet, Saint-Cezert (FR); Stéphane Billy, Grenade (FR)

(73) Assignees: Continental Automotive France; Continental Automotive GmbH

( * ) Notice: Subject to any disclaimer, the term of this patent is extended or adjusted under 35 U.S.C. 154(b) by 0 days.

(21) Appl. No.: 16/482,007

(22) PCT Filed: Feb. 9, 2018

(86) PCT No.: PCT/FR2018/050322
§ 371 (c)(1),
(2) Date: Jul. 30, 2019

(87) PCT Pub. No.: WO2018/154211
PCT Pub. Date: Aug. 30, 2018

(65) Prior Publication Data
US 2020/0361415 A1     Nov. 19, 2020

(30) Foreign Application Priority Data
Feb. 23, 2017  (FR) .................................... 17 51424

(51) Int. Cl.
*B60R 25/31*   (2013.01)
*H03K 17/945*  (2006.01)
(Continued)

(52) U.S. Cl.
CPC .............. *B60R 25/31* (2013.01); *B60R 25/01* (2013.01); *H03K 17/945* (2013.01); *H01Q 1/3241* (2013.01)

(58) Field of Classification Search
CPC ...... B60R 25/31; B60R 25/01; H01Q 1/3241; H03K 17/945
(Continued)

(56) References Cited

U.S. PATENT DOCUMENTS 9,975,521 B2 *   5/2018  Menard .............. G07C 9/00309
10,684,243 B2 *  6/2020  Menard .................. G01N 27/22
(Continued)

OTHER PUBLICATIONS

English Translation of the Written Opinion for International Application No. PCT/FR2018/050322, dated May 4, 2018, 6 pages.
(Continued)

*Primary Examiner* — Vernal U Brown
(74) *Attorney, Agent, or Firm* — RatnerPrestia

(57) ABSTRACT

A method for detecting the presence of a human hand on an opening element of a motor vehicle. The method includes determination of a power variation profile and detection of the presence of a human hand on the opening element being performed when the determined profile corresponds to a predetermined reference profile characterized by an increase followed by a first decrease in the power value, characterizing the approach of a human hand, followed by a stagnation and a second decrease in the power value, characterizing contact of a human hand with the opening element of the vehicle.

12 Claims, 7 Drawing Sheets

(51) Int. Cl.
*B60R 25/01* (2013.01)
*H01Q 1/32* (2006.01)
(58) Field of Classification Search
USPC .......................................................... 340/5.61
See application file for complete search history.

(56) References Cited

U.S. PATENT DOCUMENTS

| 2004/0257267 | A1  | 12/2004 | Mafune et al. |
| 2007/0247299 | A1  | 10/2007 | Richards |
| 2013/0324056 | A1  | 12/2013 | Maguire |
| 2017/0282858 | A1* | 10/2017 | Sass ........................ B60R 25/24 |

OTHER PUBLICATIONS

International Search Report and Written Opinion for International Application No. PCT/FR2018/050322, dated May 4, 2018—8 pages.

* cited by examiner

Prior Art

METHOD AND SYSTEM FOR DETECTING THE PRESENCE OF A HUMAN HAND ON A MOTOR VEHICLE OPENING ELEMENT

CROSS REFERENCE TO RELATED APPLICATIONS

This application is the U.S. National Phase Application of PCT International Application No. PCT/FR2018/050322, filed Feb. 9, 2018, which claims priority to French Patent Application No. 1751424, filed Feb. 23, 2017, the contents of such applications being incorporated by reference herein.

FIELD OF THE INVENTION

The present invention pertains to the field of presence detection, and relates more particularly to a method and a system for detecting the presence of a human hand on a motor vehicle opening element. The invention aims in particular to allow reliable detection of the presence of a hand on the handle of a motor vehicle opening element so as to lock or unlock said vehicle.

BACKGROUND OF THE INVENTION

Nowadays, some motor vehicle opening elements, for example the doors or the trunk, are equipped with devices for detecting the presence of a user, allowing them to be locked or unlocked. More precisely, the detection of the presence of a user coupled with the recognition of an identifier contained in a "hands-free" access device carried by this user, for example an electronic fob or a mobile telephone, allows these opening elements to be locked and unlocked remotely.

First of all, when the user approaches the vehicle, communication is established over a radio link between the access device and the detection device in order for the access device to authenticate itself.

Second of all, when the user carrying the electronic fob or the corresponding telephone has been authenticated and wishes to unlock the vehicle, he places his hand in front of or on an unlocking zone of an opening element of the vehicle, for example situated on the handle of said opening element, comprising an approach detection sensor, and the opening element or all of the opening elements of the vehicle are then automatically unlocked.

Likewise, when the user carrying the electronic fob or the telephone leaves the vehicle and wishes to lock it, he closes the opening element again and places his hand in front of or on a zone, called locking zone, of the opening element, for example also situated on the handle of said opening element, and the opening element or all of the opening elements of the vehicle are then automatically locked.

To communicate with the access device, the detection device comprises a radio antenna that is linked to an electronic computer of the vehicle (called ECU for "electronic control unit"), allowing the access device to be authenticated.

This antenna may be a radiofrequency antenna, commonly called an RF antenna, that allows communication at frequencies of between 100 MHz and 1 GHz, for example 315 MHz and 433.92 MHz, or a low-frequency antenna, commonly called LF antenna, that allows communication at frequencies lower than 1 MHz, for example at 125 kHz.

If the access device is a mobile telephone, RF and LF communication with the vehicle is not always possible, since most mobile telephones do not have any RF, or LF, communication means whose frequencies are compatible with those used during communication with the vehicle, such as the frequencies of 315 MHz and 433.92 MHz for RF and 125 kHz for LF.

However, most mobile telephones nowadays employ the Bluetooth® or Bluetooth® Low Energy (BLE) communication standard, that is to say communication at ultra-high frequency (UHF) from 2.4 GHz to 2.48 GHz. This communication standard exhibits the advantage of being universal and does not necessarily involve any accreditation specific to each country (only a Bluetooth® Low Energy international certification), as is the case with the current RF and LF communication standards whose operating frequency differs according to country. In addition, the Bluetooth® and BLE communication standards allow a relatively far communication range, of approximately 100 m around the vehicle for BLE. Bluetooth® communication therefore exhibits numerous advantages with respect to low frequency.

To be able to use a mobile telephone equipped with a Bluetooth® or BLE communication module, it was therefore necessary to adapt the "hands-free" access and/or starting system of the vehicle in order for it also to be able to operate with a mobile telephone equipped with the Bluetooth® communication standard, and no longer just through LF and RF communications.

In RF/LF systems, the opening elements are locked and unlocked using two capacitive sensors, taking the form of two electrodes that are linked electrically to a printed circuit and integrated into the door handle. Generally, one electrode is installed in the locking zone, that is to say that it is dedicated to detecting the approach and/or the contact of the hand of the user in the locking zone, and the other electrode is installed in the unlocking zone, separate from the locking zone, and is dedicated to detecting the approach and/or the contact of the hand of the user in the unlocking zone.

When the presence of a human hand has been detected in a locking or unlocking zone, the detection device sends a presence detection signal to the electronic computer (ECU) so as to respectively lock or unlock the opening element or opening elements, the electronic computer of the vehicle having previously authenticated the user as being authorized to access this vehicle (or alternatively, following reception of this presence detection signal, it performs this authentication).

As explained above, when the access device is a mobile telephone, the identifier is exchanged through Bluetooth® communication. In this case, the vehicles are then equipped with opening element handles comprising a detection device, itself comprising an ultra-high-frequency (UHF) antenna, allowing Bluetooth Communication®, and two electrodes that are linked to a microcontroller integrated into a printed circuit and are supplied with a voltage.

Purely for the sake of explanation, consideration will be given hereinafter to a detection device comprising two capacitive sensors in the form of two electrodes, one electrode dedicated to the unlocking zone and one electrode dedicated to the locking zone, said two electrodes being linked to a printed circuit comprising a microcontroller, and an antenna.

A detection device D from the prior art is described with reference to FIG. 1. This FIG. 1 shows a door P handle 100 of a motor vehicle (not shown) defining an inner space B in which there is situated a device D for detecting the presence of a user. Said door P handle 100 comprises a first outer surface S1 oriented in the direction of the door P and a second outer surface S2, opposite the first outer surface S1 and therefore oriented on the side opposite the vehicle, more precisely toward the user (not shown).

This detection device D comprises a first unlocking electrode E2, one face of which is situated close to the first outer surface S1, and control means 60 and a UHF antenna A, one face of which is situated close to the second outer surface S2, a second locking electrode E1, one face of which is situated close to the second outer surface S2, and control means 60. The first and the second electrode E1, E2 are linked to the control means 60.

These control means 60 measure the capacitance between the terminal of each first and second electrode E1, E2 and ground, formed by the hand M of the approaching user, so as to detect the presence (the approach and/or the contact) of a user in the detection zones, that is to say in a locking zone Z1 or in an unlocking zone Z2. These control means 60 consist for example of a microcontroller integrated into a printed circuit 80.

The ultra-high-frequency antenna A is for its part linked to an electronic computer on board the vehicle (not shown) of BCM ("body controller module") type, which manages the identification requests transmitted by said ultra-high-frequency antenna A.

When the hand M of the user approaches the electrode E1 or E2, the user acts as a second electrode, linked to ground, which increases the capacitance of the detection capacitor to a capacitance higher than the nominal capacitance of the detection capacitor "at rest" (that is to say in the absence of a user). The change in the capacitance above a threshold confirms the detection of the approach of the hand of the user.

However, this detection device D from the prior art exhibits major drawbacks. Specifically, the detection of the approach of a user using capacitive sensors (first and second electrode E1 and E2) is not robust and may generate false detections.

In particular, in some environmental conditions, when the ambient air is humid or when there is salt on the roads, capacitive coupling may be created between the detection zones (locking zone Z1 and unlocking zone Z2) and the metal parts of the vehicle, thereby preventing any detection of the presence of a user using the capacitive sensors.

In addition, raindrops or snowflakes on the door handle may increase the capacitance measured by the capacitive sensors, thus triggering false detections.

Other drawbacks stem from the cost incurred by the device (the two electrodes are made of copper) and by the space necessary inside the handle in order to house the device therein.

SUMMARY OF THE INVENTION

The aim of an aspect of the invention is to at least partly rectify these drawbacks by proposing a detection method and device not requiring capacitive sensors, thus making it possible to reduce the cost and the size of the detection device and also to overcome false detections that are inherent to the detection device using capacitive sensors.

To this end, an aspect of the invention first of all relates to a method for detecting the presence of a human hand on an opening element of a motor vehicle using a first ultra-high-frequency transceiver device, installed in said opening element, and a second ultra-high-frequency transceiver device, for the purpose of activating a function of said vehicle.

The method is noteworthy in that it comprises the steps of transmission, by the first ultra-high-frequency transceiver device, of a plurality of detection signals, of reception, by the second ultra-high-frequency transceiver device, of each detection signal of said transmitted plurality of detection signals, of measurement, by the second ultra-high-frequency transceiver device, of the power of each received detection signal, of determination of a power variation profile on the basis of the measured power values, and of detection of the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle.

The method according to an aspect of the invention makes it possible to detect a user close to the vehicle without using a capacitive sensor, thereby simplifying the detection device and reducing costs. Furthermore, the use of power measurements constituting a signature of a user proves to be a fast, reliable and effective means for detecting the hand of the user on the opening element.

Preferably, the method comprises a preliminary step of determining the reference profile.

In a first embodiment, the determination of the power variation profile and the detection of the presence of a human hand on the opening element are performed by the second ultra-high-frequency transceiver device, the method then furthermore comprising a step of sending, by the second ultra-high-frequency transceiver device, of a presence detection message to the first ultra-high-frequency transceiver device so as to activate a function of the vehicle.

In a second embodiment, the method furthermore comprises a step of sending, by the second ultra-high-frequency transceiver device, of the measured power values to the first ultra-high-frequency transceiver device, the determination of a power variation profile and the detection of the presence of a human hand on the opening element being performed by the first ultra-high-frequency transceiver device.

Preferably, the function activated following the detection of the presence of the hand on the opening element is locking or unlocking of said opening element.

According to one aspect of the invention, the first ultra-high-frequency transceiver device and the second ultra-high-frequency transceiver device operate in the frequency band of 300 MHz-3 GHz, preferably between 2 GHz and 3 GHz, for example around 2.4-2.48 GHz over a Bluetooth® or Bluetooth Low Energy BLE radio communication link, which allows a large communication range (approximately 100 m around the vehicle for BLE). Bluetooth® communication exhibits numerous advantages with respect to low frequency.

Preferably, the method comprises a step of sending, by the second ultra-high-frequency transceiver device, of its identifier to the first ultra-high-frequency transceiver device.

An aspect of the invention also relates to a first ultra-high-frequency transceiver device for detecting the presence of a human hand on a vehicle opening element, said first ultra-high-frequency transceiver device being intended to be installed in said opening element, for example at least partly on a handle of said opening element.

In a first embodiment, the first ultra-high-frequency transceiver device is configured so as to transmit a plurality of detection signals to a second ultra-high-frequency transceiver device and so as to receive a presence detection message from said second ultra-high-frequency transceiver device.

In a second embodiment, the first ultra-high-frequency transceiver device is configured so as to transmit a plurality of detection signals, so as to receive, from a second ultra-high-frequency transceiver device, a plurality of power values in relation to the transmitted signals measured by said second ultra-high-frequency transceiver device, so as to determine a power variation profile on the basis of received power values, and so as to detect the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle.

An aspect of the invention also relates to a second ultra-high-frequency transceiver device for detecting the presence of a human hand on an opening element of a vehicle. This second ultra-high-frequency transceiver device may be portable and borne by a user or else installed in the vehicle, for example another opening element of the vehicle (for example at least partly on the handle thereof).

In a first embodiment, the second ultra-high-frequency transceiver device is configured so as to receive a plurality of detection signals transmitted by a first ultra-high-frequency transceiver device installed in the vehicle, so as to measure the power of each received detection signal and so as to send the power values of the received detection signals to the first ultra-high-frequency transceiver device.

In a second embodiment, the second ultra-high-frequency transceiver device is configured so as to receive a plurality of detection signals, transmitted by a first ultra-high-frequency transceiver device installed in an opening element of the vehicle, so as to measure the power of each received detection signal, so as to determine a power variation profile on the basis of the measured power values, so as to detect the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle, and so as to send a presence detection message to the vehicle, in particular a first ultra-high-frequency transceiver device as presented above, when the presence of a human hand has been detected.

An aspect of the invention also relates to a vehicle, preferably a motor vehicle, comprising at least one first ultra-high-frequency transceiver device as presented above and/or at least one second ultra-high-frequency transceiver device as presented above.

An aspect of the invention also relates to a system for detecting the presence of a human hand on an opening element of a vehicle using a first ultra-high-frequency transceiver device, installed in said opening element, and a second ultra-high-frequency transceiver device, for the purpose of activating a function of said vehicle.

In a first embodiment, the system comprises a first ultra-high-frequency transceiver device configured so as to transmit a plurality of detection signals and so as to receive a presence detection message of a human hand on the opening element, and a second ultra-high-frequency transceiver device configured so as to receive a plurality of detection signals transmitted by the first ultra-high-frequency transceiver device, so as to measure the power of each received detection signal, so as to determine a power variation profile on the basis of the measured power values, so as to detect the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle, and so as to send a presence detection message to the first ultra-high-frequency transceiver device destined for the vehicle.

In a second embodiment, the system comprises a first ultra-high-frequency transceiver device configured so as to transmit a plurality of detection signals and a second ultra-high-frequency transceiver device configured so as to receive a plurality of detection signals transmitted by the first ultra-high-frequency transceiver device, so as to measure the power of each received detection signal and so as to send the power values of the received detection signals to the first ultra-high-frequency transceiver device, the first ultra-high-frequency transceiver device furthermore being configured so as to determine a power variation profile on the basis of power values received from the second ultra-high-frequency transceiver device and so as to detect the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle.

Advantageously, the opening element comprises a handle and the first ultra-high-frequency transceiver device is at least partly installed in said handle.

Preferably, the second ultra-high-frequency transceiver device is configured so as to send its identifier to the first ultra-high-frequency transceiver device.

Again preferably, the first ultra-high-frequency transceiver device and the second ultra-high-frequency transceiver device are configured so as to transmit and receive signals at a frequency of between 300 MHz and 3 GHz, preferably greater than or equal to 2.4 GHz, for example over a Bluetooth® or Bluetooth Low Energy BLE radio communication link.

DETAILED DESCRIPTION OF THE PREFERRED EMBODIMENTS

Aspects of the invention will be described below in terms of its application to the unlocking of a motor vehicle door. It will however be noted that an aspect of the invention is not limited to this case of application, and that it may apply for example to the locking of a motor vehicle door, to the opening of a motor vehicle trunk, to the starting of the engine of the vehicle, to the detection of the presence of a driver of a motorcycle on the seat of said motorcycle, or to any other suitable application.

FIGS. 2 to 5 show four embodiments of the system 1 according to an aspect of the invention.

The system 1 according to an aspect of the invention comprises a first ultra-high-frequency transceiver device 10A, 10B installed in a vehicle 5 and a second ultra-high-frequency transceiver device 20A1, 20A2, 20B1, 20B2.

In this example, the first ultra-high-frequency transceiver device 10A, 10B is at least partly installed on the driver's handle of the vehicle 5.

More precisely, the first ultra-high-frequency transceiver device 10A, 10B comprises an ultra-high-frequency antenna (not shown), installed in the handle, and a management module 15 linked to the UHF antenna by a communication link, for example a CAN bus of the vehicle 5 that is known per se. This management module 15 may for example take the form of an ECU or BCM computer.

The antenna is an ultra-high-frequency (UHF) antenna configured so as to operate in the frequency band of 300 MHz-3 GHz.

In the four embodiments that are shown, the first ultra-high-frequency transceiver device 10A, 10B is configured so as to periodically transmit a plurality of detection signals. By way of example, the first ultra-high-frequency transceiver device 10A, 10B may be configured so as to transmit a detection signal taking the form of a pulse or of a voltage spike, for example with an amplitude of 0.71 V and with a duration of between 1.6 and 200 ms (for example every 150 ms).

Preferably, the second ultra-high-frequency transceiver device 20A1, 20A2, 20B1, 20B2 is configured so as to send its identifier to the first ultra-high-frequency transceiver device 10A, 10B so as to be authenticated, i.e. to be authorized to lock or unlock the opening elements (or start the engine).

In the four embodiments that are shown, the second ultra-high-frequency transceiver device 20A1, 20A2, 20B1, 20B2 is configured so as to receive a plurality of detection signals, transmitted by the first ultra-high-frequency transceiver device 10A, 10B, and so as to measure the power of each received detection signal.

Figure 1:
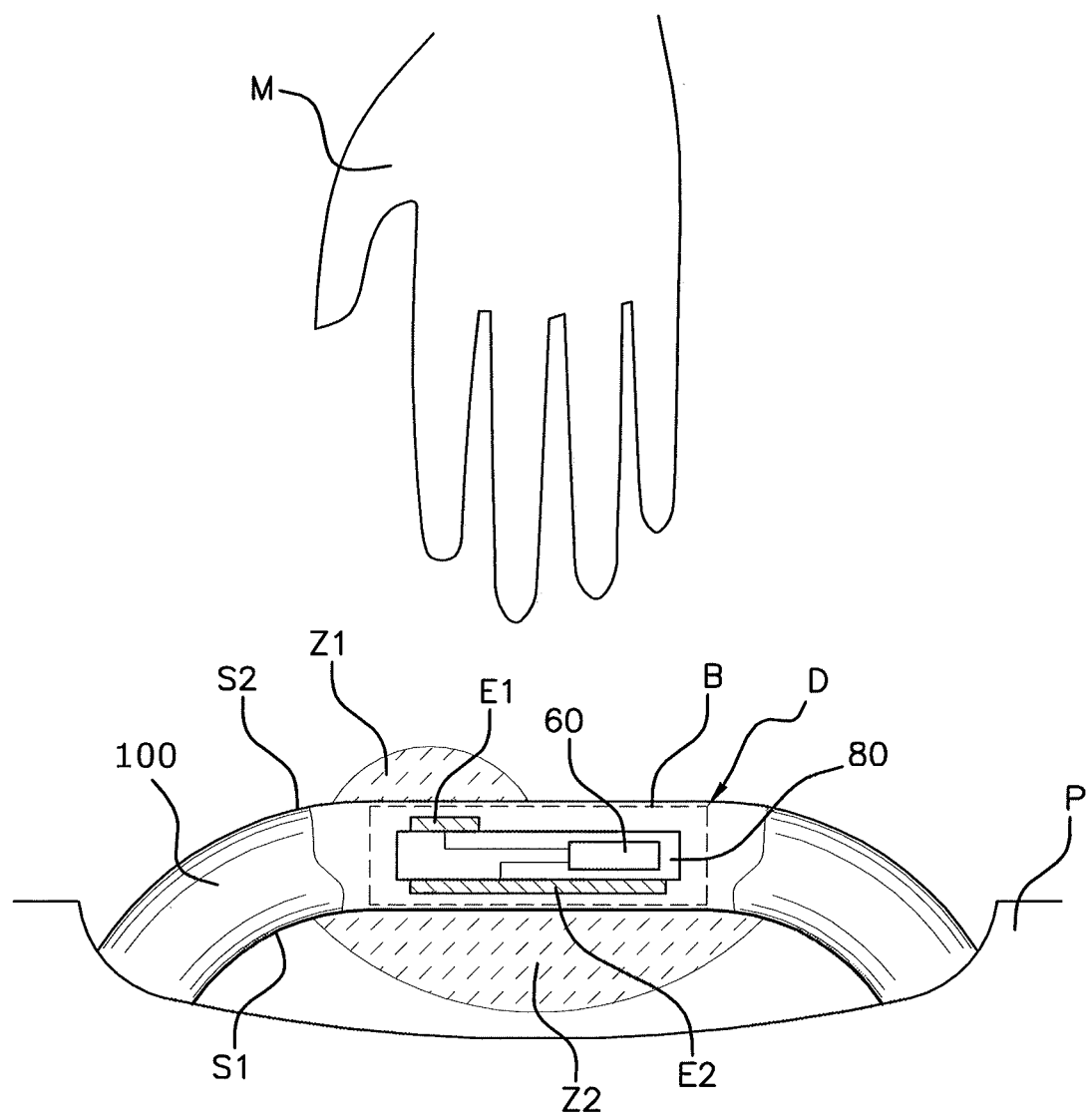
FIG. 1 (already commented upon) schematically shows a vehicle door handle comprising a detection device from the prior art.
Figure 2:
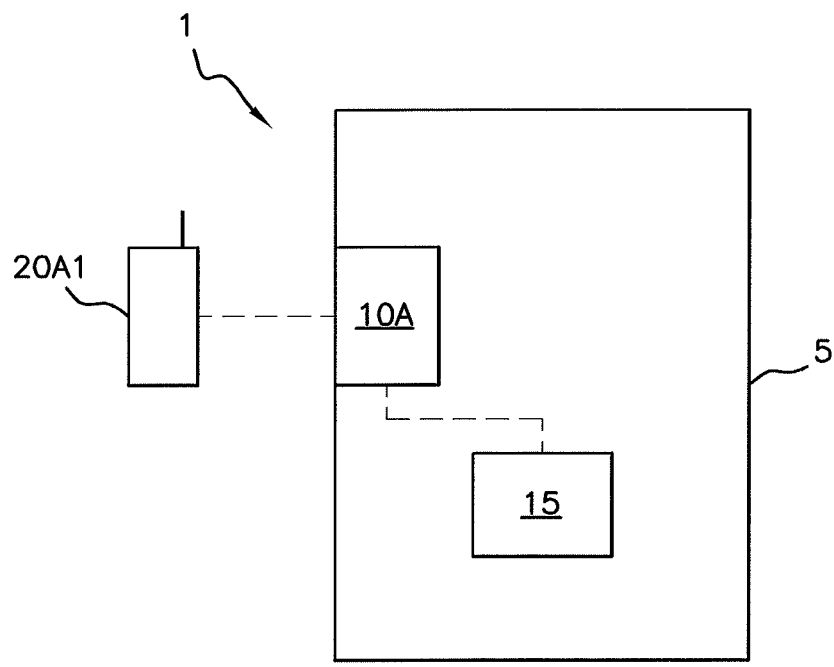
FIG. 2 schematically illustrates a first embodiment of the system according to an aspect of the invention.
Figure 3:
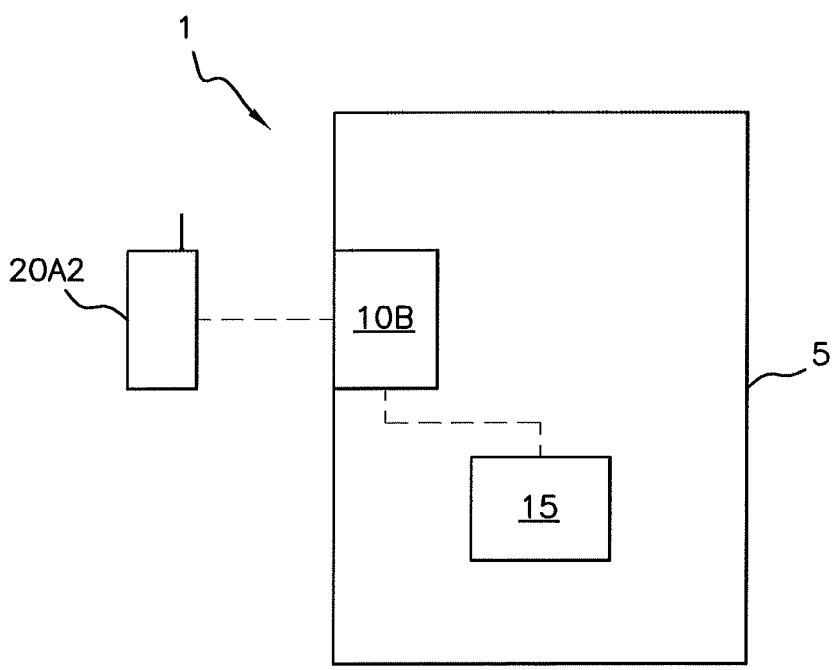
FIG. 3 schematically illustrates a second embodiment of the system according to an aspect of the invention.

In the first embodiment illustrated in FIG. 2 and in the second embodiment illustrated in FIG. 3, the second ultra-high-frequency transceiver device 20A1, 20A2 is a portable device, for example a smartphone, carried by a user.

Figure 4:
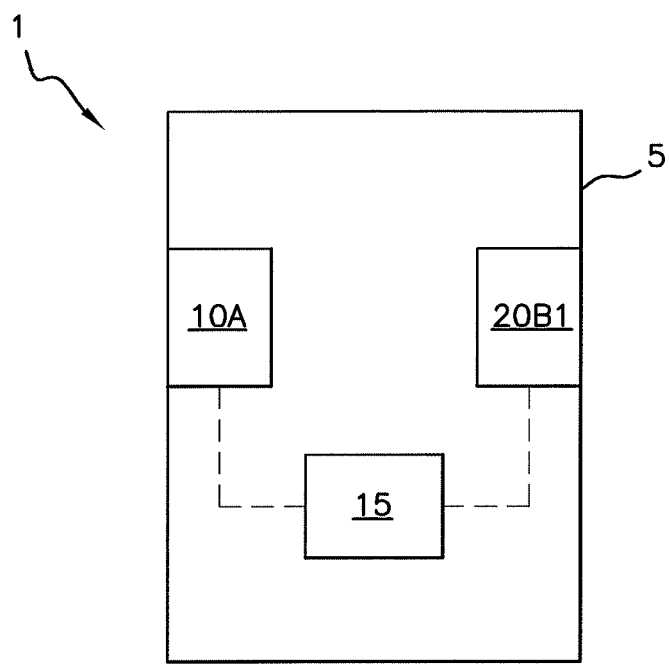
FIG. 4 schematically illustrates a third embodiment of the system according to an aspect of the invention.
Figure 5:
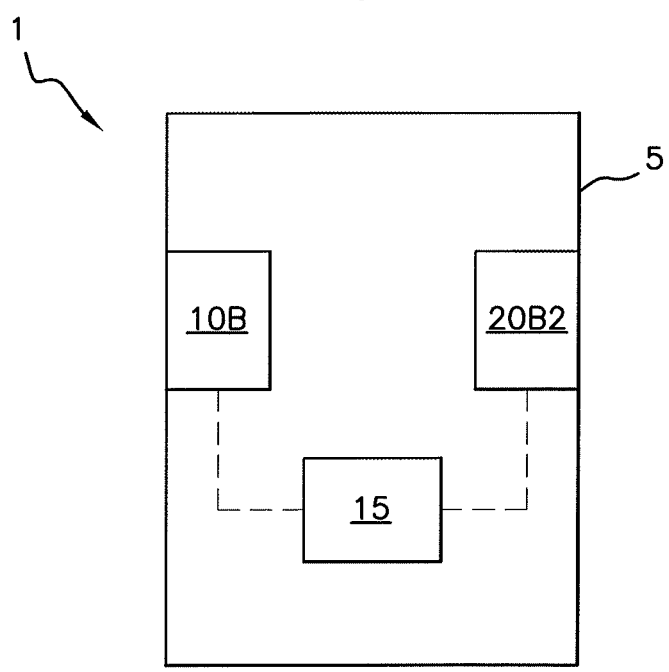
FIG. 5 schematically illustrates a fourth embodiment of the system according to an aspect of the invention.

In the third embodiment illustrated in FIG. 4 and in the fourth embodiment illustrated in FIG. 5, the second ultra-high-frequency transceiver device 20B1, 20B2 is installed in the vehicle 5. It may be for example the detection device of another door handle of the vehicle.

In the first embodiment illustrated in FIG. 2 and in the third embodiment illustrated in FIG. 4, the first ultra-high-frequency transceiver device 10A is configured so as to receive a detection message sent by the second ultra-high-frequency transceiver device 20A1, 20B1, and the second ultra-high-frequency transceiver device 20A1, 20B1 is configured so as to measure the power of the signals received from the first ultra-high-frequency transceiver device 10A, so as to determine a power variation profile on the basis of the measured power values, so as to detect the presence of a human hand on the handle when the determined profile corresponds to a predetermined reference profile, and so as to send a detection message to the first ultra-high-frequency transceiver device 10A where applicable.

In the second embodiment illustrated in FIG. 3 and in the fourth embodiment illustrated in FIG. 5, the second ultra-high-frequency transceiver device 20A2, 20B2 is configured so as to measure the power of the signals received from the first ultra-high-frequency transceiver device 10B and so as to send the power values of the measured detection signals to the first ultra-high-frequency transceiver device 10B, and the first ultra-high-frequency transceiver device 10B is configured so as to determine a power variation profile on the basis of the power values received from the second ultra-high-frequency transceiver device 20A2, 20B2 and so as to detect the presence of a human hand on the handle when the determined profile corresponds to a predetermined reference profile.

Figure 6:
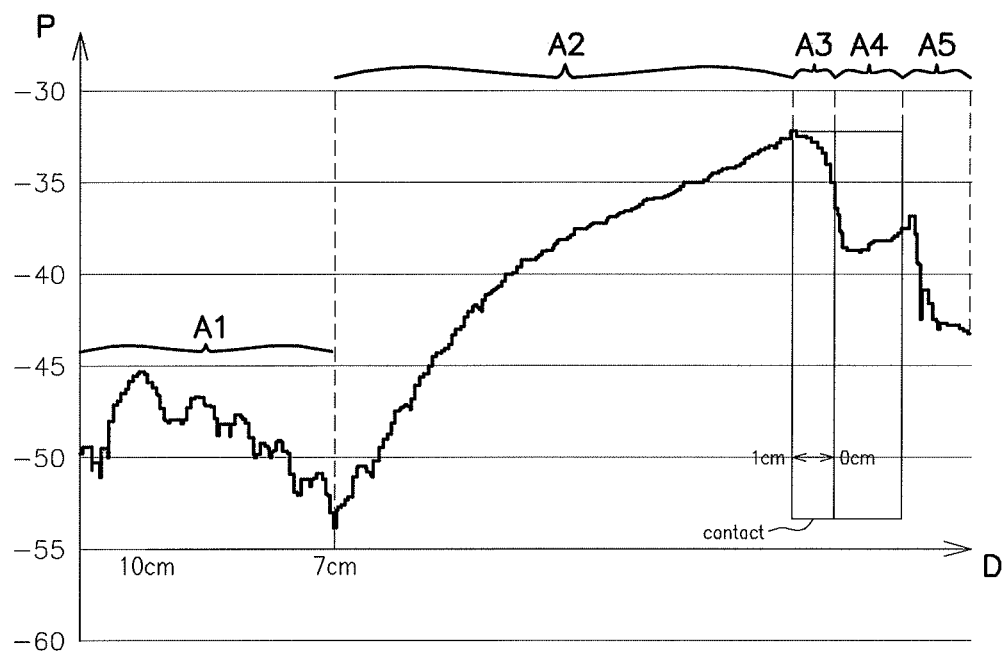
FIG. 6 shows an exemplary reference profile representative of the power radiated upon the approach of a human hand close to a door handle of a vehicle comprising the system according to an aspect of the invention.

FIG. 6 shows an exemplary reference profile of the power Pi received by the second ultra-high-frequency transceiver device 20A1, 20A2, 20B1, 20B2 from the first ultra-high-frequency transceiver device 10A, 10B as a function of the distance D between a human hand and a vehicle 5 door P handle 100. This profile is representative of the presence, that is to say the approach and then the contact, of a human hand on a vehicle 5 door P handle 100 in the presence of ultra-high-frequency electromagnetic waves transmitted by the antenna of the first ultra-high-frequency transceiver device 10A, 10B and received by the second ultra-high-frequency transceiver device 20A1, 20A2, 20B1, 20B2.

As may be seen in FIG. 6, the ultra-high-frequency electromagnetic waves are subject to interference upon the approach and upon the contact of the hand on the handle 100.

When the user is spaced from the vehicle 5, for example more than 7 cm away from the antenna of the first ultra-high-frequency transceiver device 10A, 10B (cf. zone A2 in FIG. 6), that is to say the door P handle 100, the power Pi of the signals received by the second ultra-high-frequency transceiver device 20A1, 20A2, 20B1, 20B2 is low and oscillates slightly due to electronic noise.

It will be noted that the distances indicated in the present example, and in particular the distance of 7 cm, depend on the design of the antenna, such that these distances could be different, for example greater, in another embodiment of the system, without departing from the spirit of an aspect of the present invention.

In this non-limiting example, as soon as the user approaches within 7 cm and up to within approximately 1 cm from the door P handle 100 (cf. zone A2 in FIG. 6), the power value Pi of the received signals increases considerably. Next, when the hand of the user is situated between approximately 1 cm and 0 cm (cf. zone A3 in FIG. 6) from the handle 100 (i.e. when it comes into contact with the handle), a decrease in the power value Pi of the signals received by the second ultra-high-frequency transceiver device 20A1, 20A2, 20B1, 20B2 is observed. When the user has his hand on the handle 100 (cf. zone A4 in FIG. 6) for a few tenths of a second, a stagnation in the power value Pi of the received signals is then observed. Past this short time interval, a second decrease (cf. zone A5 in FIG. 6) of the power value Pi of the received signals is lastly observed, characterizing the fact that the body of the user, positioned and in continuous contact with the handle 100, short-circuits the antenna of the first ultra-high-frequency transceiver device 10A, 10B, that is to say that it absorbs the waves transmitted by the ultra-high-frequency antenna.

This interference phenomenon on electromagnetic waves is specific to ultra-high-frequency waves, and has not been observed in radio waves or low-frequency waves.

An aspect of the invention therefore expediently proposes to exploit this phenomenon, and the specific signature of the ultra-high-frequency waves transmitted upon the approach of a hand of a user so as to determine the approach and the contact of the user on the handle 100, thus making it possible to dispense with capacitive approach detection sensors.

Figure 7:
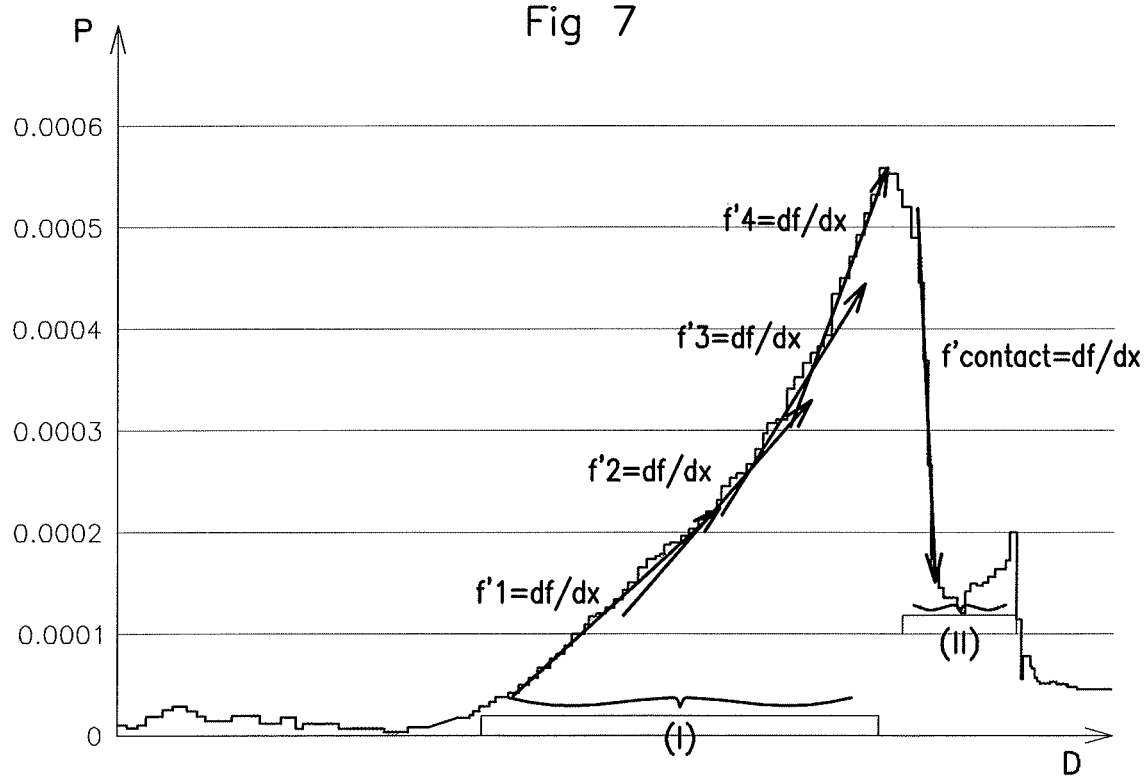
FIG. 7 shows an exemplary characterization, by the slope of the radiated power signal, of a reference profile representative of the approach of a human hand close to a door handle of a vehicle comprising the system according to an aspect of the invention.

These evolutions may then be characterized in terms of slope f of the signal representative of the received power Pi, that is to say the drift in the received power with respect to the distance D, over the various portions as illustrated in FIG. 7. In this example, the drift of the signal (f'1, f'2, f'3, f'4) is positive while at the same time increasing over four first portions during a phase (I) of approach of the hand between 7 and 1 cm from the handle 100, and a maximum is then reached when the hand is approximately 1 cm away from the handle 100. The signal then exhibits significant negative drift f'contact over a fifth portion in a second phase (II) of approach of the hand between 1 and 0 cm from the handle 100, before stagnating and then decreasing slightly when the hand is in contact with the handle 100.

Figure 8:
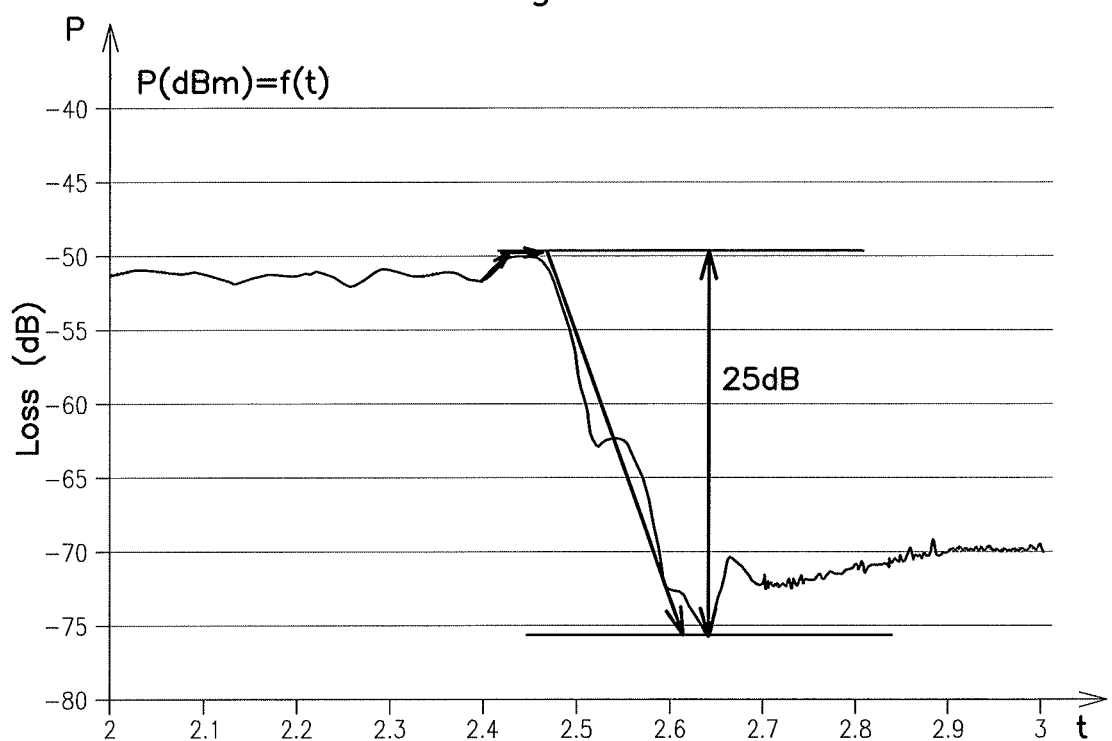
FIG. 8 shows an exemplary reference profile representative of the power radiated upon the approach of a human hand close to a door handle of a vehicle comprising the system according to an aspect of the invention.
Figure 9:
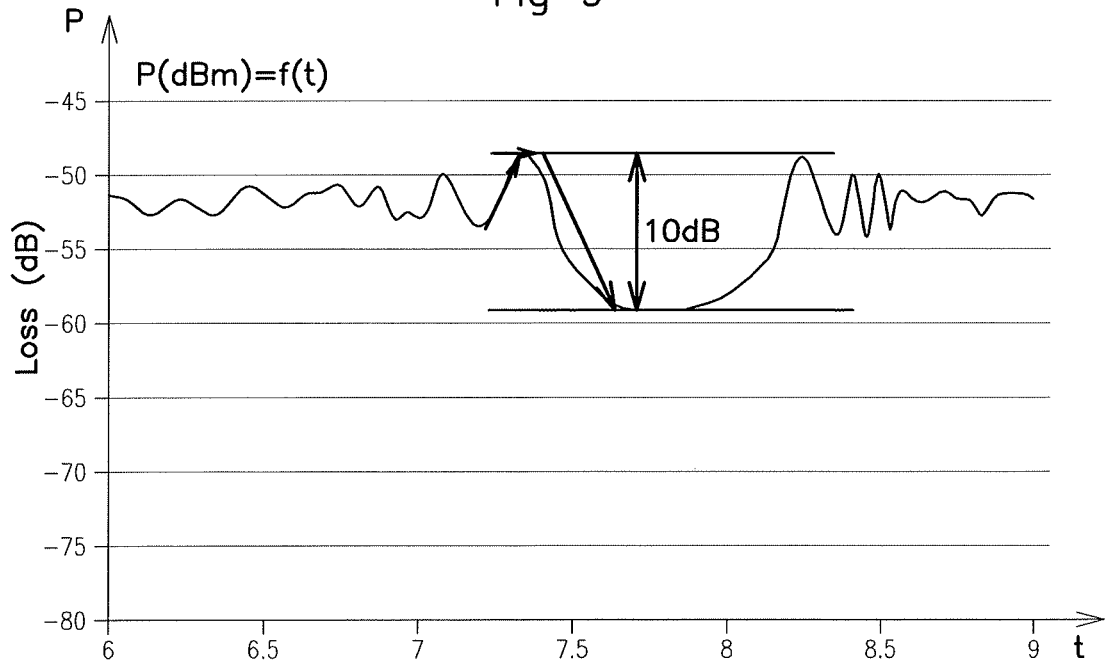
FIG. 9 shows an exemplary reference profile representative of the power radiated upon the approach of a human body (torso) close to a door handle of a vehicle comprising the system according to an aspect of the invention.
Figure 10:
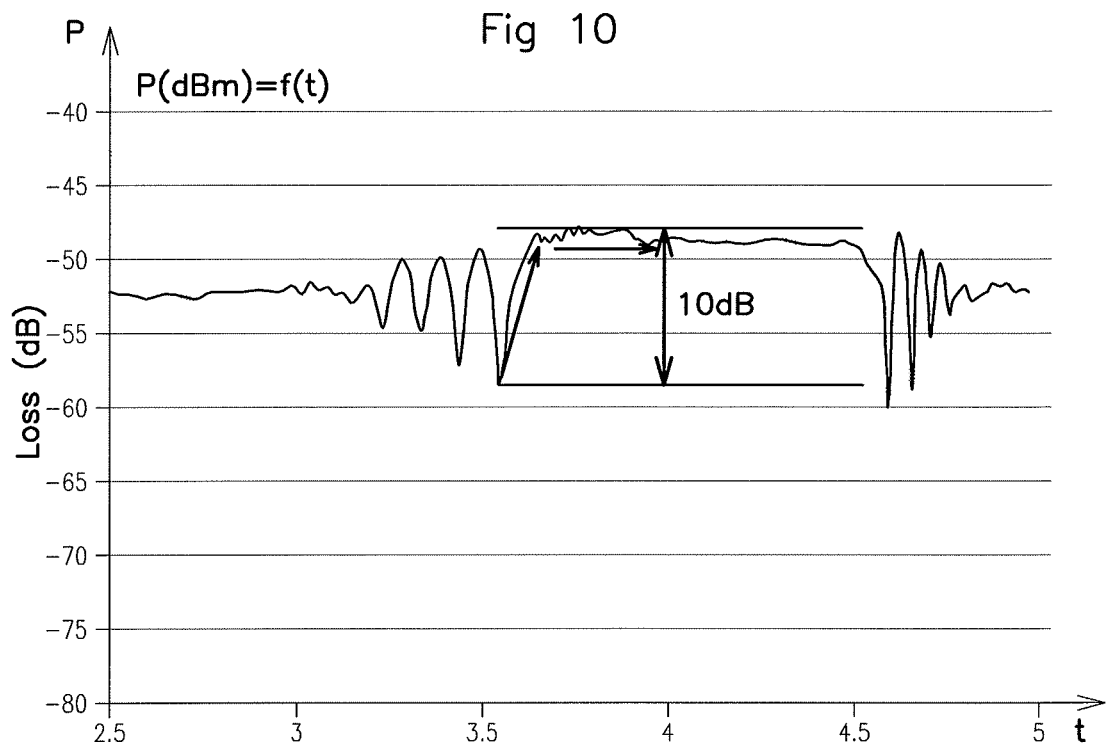
FIG. 10 shows an exemplary reference profile representative of the power radiated upon the approach of a metal plate close to a door handle of a vehicle comprising the system according to an aspect of the invention.

FIGS. 8 to 10 show exemplary signals of power radiated by an ultra-high-frequency device (i.e.: power received Pi by an ultra-high-frequency receiver receiving the waves transmitted by said device) upon the approach, respectively, of a human hand, a human torso and a metal plate. It is observed that each object has a specific interference signature on the transmitted ultra-high-frequency electromagnetic waves, such that the determination of a hand is able to be performed with a high probability with respect to another object.

It is observed in particular that a human hand coming into contact with a door P handle 100 (cf. FIG. 8) leads to a significant drop in the power of the order of 25 dB for a relatively brief time, of the order of 200 ms.

By contrast, contact with another part of the body, which is less intense than a grip, causes a far less significant power drop, of the order of 10 dB (cf. FIG. 9), and over a slightly longer time, of the order of 300 ms.

Contact with a metal plate leads on the other hand to an increase in the radiated power (cf. FIG. 10), of the order of 10 dB, for a relatively long time, for example of the order of 600 ms.

Such a characterization in terms of amplitude and in terms of variation of the transmitted ultra-high-frequency electromagnetic field thus makes it possible to easily identify a human hand approaching and making contact with a handle 100 of an opening element of the vehicle so as to allow unlocking thereof.

It will however be noted that an aspect of the present invention is not limited to the detection of a human hand, but any part of the body from the time when said part is able to be characterized by a profile or a distinctive signature. For example, a reference profile of a foot may be used to unlock the trunk of the vehicle when said foot passes close to a first ultra-high-frequency transceiver device 10A, 10B installed underneath said trunk.

An aspect of the invention will now be described in terms of the implementation thereof, more particularly with reference to FIGS. 11 and 12.

In a preliminary step E0, a reference profile is defined that is representative of the variations in the power Pi of the signals received by the second ultra-high-frequency transceiver device 20A1, 20A2, 20B1, 20B2 from the first ultra-high-frequency transceiver device 10A, 10B when a user approaches a specific part of his body towards said first ultra-high-frequency transceiver device 10A, 10B, for example his hand, and then comes into contact with the part of the vehicle in which the first ultra-high-frequency transceiver device 10A, 10B is installed (for example a door handle).

Once the reference profile has been defined, the method may then be repeated in its consecutive steps E1 to E7.

In a step E1, the first ultra-high-frequency transceiver device 10A, 10B periodically transmits a detection signal that is received by the second ultra-high-frequency transceiver device 20A1, 20A2, 20B1, 20B2 in a step E2.

The transmission of this detection signal by the antenna of the first ultra-high-frequency transceiver device 10A, 10B generates an electromagnetic field.

When a user approaches the vehicle 5, his body modifies the electromagnetic field generated upon the transmission of the detection signal, such that the power Pi of the detection signal received by the second ultra-high-frequency transceiver device 20A1, 20A2, 20B1, 20B2 varies.

The second ultra-high-frequency transceiver device 20A1, 20A2, 20B1, 20B2 measures the power of the received detection signals as the user approaches the vehicle 5 in a step E3.

Figure 11:
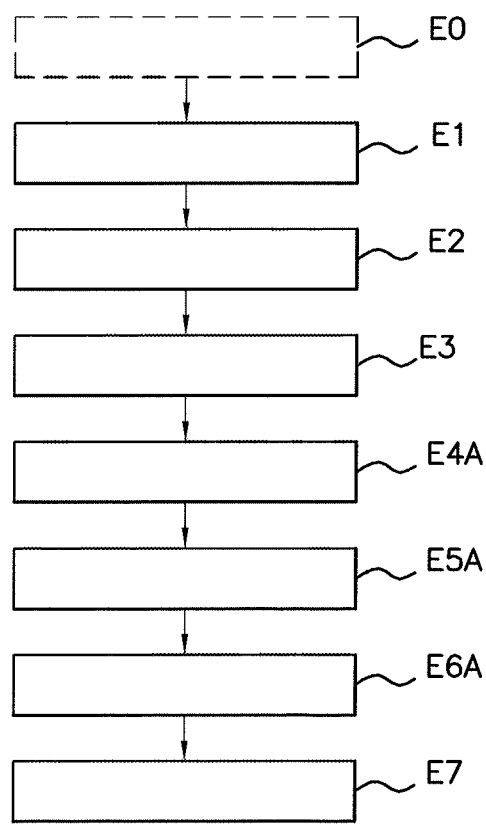
FIG. 11 schematically illustrates a first embodiment of the method according to an aspect of the invention.

In the first embodiment of the system 1 of FIG. 2 and with reference to FIG. 11, the second ultra-high-frequency transceiver device 20A1, borne by the user, determines a received power Pi variation profile on the basis of the measured power values (step E4A). The presence of the user is detected by the second ultra-high-frequency transceiver device 20A1 in a step E5A when the variation profile thus determined corresponds to the reference profile predetermined in step E0. In this case, the second ultra-high-frequency transceiver device 20A1 sends, in a step E6A, a detection message to the first ultra-high-frequency transceiver device 10A so that it unlocks the door (activation of a function of the vehicle 5 in a step E7).

Figure 12:
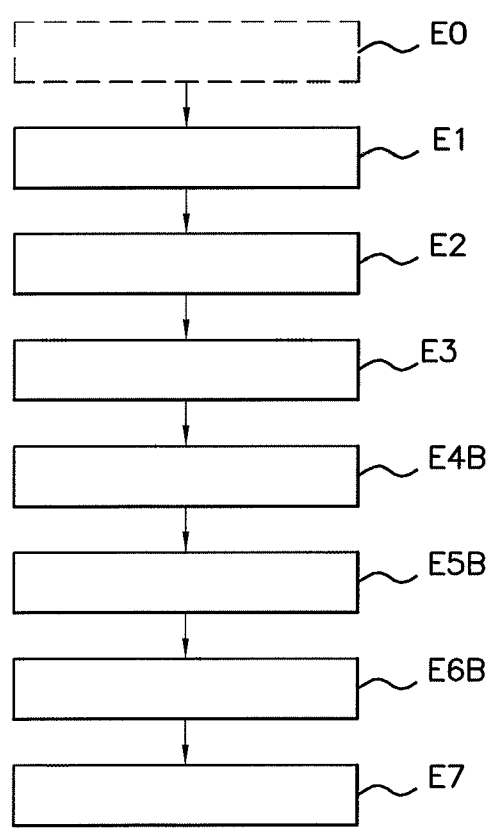
FIG. 12 schematically illustrates a second embodiment of the method according to an aspect of the invention.

In the second embodiment of the system 1 of FIG. 3 and with reference to FIG. 12, the second ultra-high-frequency transceiver device 20A2, borne by the user, sends the measured received power Pi values to the first ultra-highfrequency transceiver device 108 (step E46). The first ultra-high-frequency transceiver device 10B then determines a power variation profile on the basis of the received power Pi values in a step E5B. The presence of the user is detected by the first ultra-high-frequency transceiver device 10B in a step E6B when the variation profile thus determined corresponds to the reference profile predetermined in step E0, so as to unlock the door (activation of a function of the vehicle 5 in a step E7).

In the third embodiment of the system 1 of FIG. 4 and with reference to FIG. 11, the second ultra-high-frequency transceiver device 20B1, for example installed in the front passenger door in the case of an automobile, determines a received power Pi variation profile (step E4A). The presence of the user is detected by the second ultra-high-frequency transceiver device 20B1 in a step E5A when the variation profile thus determined corresponds to the received power Pi reference profile predetermined in step E0. In this case, the second ultra-high-frequency transceiver device 20B1 sends, in a step E6A, a detection message to the first ultra-high-frequency transceiver device 10A so that it unlocks the door (activation of a function of the vehicle 5 in a step E7).

In the fourth embodiment of the system 1 of FIG. 5, the second ultra-high-frequency transceiver device 20B2 and with reference to FIG. 12, for example installed in the front passenger door in the case of an automobile, sends these received power Pi measurements to the first ultra-high-frequency transceiver device 10B (step E4B). The first ultra-high-frequency transceiver device 10B then determines a received power Pi variation profile on the basis of the received power Pi values in a step E5B. The presence of the user is detected by the first ultra-high-frequency transceiver device 10B in a step E6B when the variation profile thus determined corresponds to the received power Pi reference profile predetermined in step E0, so as to unlock the door (activation of a function of the vehicle 5 in a step E7).

An aspect of the invention therefore advantageously makes it possible to detect the presence of a person wishing to activate a function of a vehicle without using a capacitive sensor installed in the vehicle. The use of a signal power profile representative of part of the human body, in particular a human hand, represents an effective and reliable means for detecting the approach of a user wishing to activate a function of the vehicle, such as for example unlocking an opening element of the vehicle.

The invention claimed is:

1. A method for detecting the presence of a human hand on an opening element of a motor vehicle using a first ultra-high-frequency transceiver device, installed in said opening element, and a second ultra-high-frequency transceiver device, for the purpose of activating a function of said vehicle, said method comprising:
   transmission, by the first ultra-high-frequency transceiver device, of a plurality of detection signals,
   reception, by the second ultra-high-frequency transceiver device, of each detection signal of said transmitted plurality of detection signals,
   measurement, by the second ultra-high-frequency transceiver device, of the power of each received detection signal,
   determination of a power variation profile on the basis of the measured received power values, and
   detection of the presence of a human hand on the opening element when the determined profile corresponds to a predetermined reference profile, said predetermined reference profile being characterized by an increase followed by a first decrease in the received power value, characterizing the approach of a human hand, followed by a stagnation and a second decrease in the power value, characterizing contact of a human hand with the opening element of the vehicle.

2. The detection method as claimed in claim 1, further comprising a preliminary step of determination of the reference profile.

3. The detection method as claimed in claim 1, wherein the determination of the power variation profile and the detection of the presence of a human hand on the opening element are performed by the second ultra-high-frequency transceiver device, and in that the method then furthermore comprises a sending, by the second ultra-high-frequency transceiver device, of a presence detection message to the first ultra-high-frequency transceiver device so as to activate a function of the vehicle.

4. The detection method as claimed in claim 2, wherein the determination of the power variation profile and the detection of the presence of a human hand on the opening element are performed by the second ultra-high-frequency transceiver device, and the method then furthermore comprises sending, by the second ultra-high-frequency transceiver device, of a presence detection message to the first ultra-high-frequency transceiver device so as to activate a function of the vehicle.

5. The detection method as claimed in claim 2, further comprising sending, by the second ultra-high-frequency transceiver device, of the measured power values to the first ultra-high-frequency transceiver device, the determination of a power variation profile and the detection of the presence of a human hand on the opening element being performed by the first ultra-high-frequency transceiver device.

6. The detection method as claimed in claim 1, further comprising sending, by the second ultra-high-frequency transceiver device, of the measured power values to the first ultra-high-frequency transceiver device, the determination of a power variation profile and the detection of the presence of a human hand on the opening element being performed by the first ultra-high-frequency transceiver device.

7. The detection method as claimed in claim 1, wherein the function activated following the detection of the presence of the hand on the opening element is locking or unlocking of said opening element.

8. The system as claimed in claim 1, wherein the opening element comprises a handle and the first ultra-high-frequency transceiver device is at least partly installed in said handle.

9. An ultra-high-frequency transceiver device for detecting the presence of a human hand on a vehicle opening element, said ultra-high-frequency transceiver device being intended to be installed in said opening element, and configured so as to:
   transmit a plurality of detection signals,
   receive, from a second ultra-high-frequency transceiver device, a plurality of power values in relation to the transmitted signals measured by said second ultra-high-frequency transceiver device,
   determine a power variation profile on the basis of the received power values, and
   detect the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle.

10. An ultra-high-frequency transceiver device for detecting the presence of a human hand on a motor vehicle opening element, wherein said ultra-high-frequency transceiver device is configured so as to:
receive a plurality of detection signals,
measure the power of each received detection signal,
determine a power variation profile on the basis of the measured power values,
detect the presence of a human hand on an opening element of the vehicle when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle, and
send a presence detection message to the vehicle when the presence of a human hand has been detected.

11. A system for detecting the presence of a human hand on an opening element of a motor vehicle using a first ultra-high-frequency transceiver device, installed in said opening element, and a second ultra-high-frequency transceiver device, for the purpose of activating a function of said vehicle, said system comprising:
a first ultra-high-frequency transceiver device configured so as to transmit a plurality of detection signals and so as to receive a presence detection message of a human hand on the opening element,
a second ultra-high-frequency transceiver device configured so as to receive a plurality of detection signals transmitted by the first ultra-high-frequency transceiver device, so as to measure the power of each received detection signal, so as to determine a power variation profile on the basis of the measured power values, so as to detect the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle, and so as to send a presence detection message to the first ultra-high-frequency transceiver device.

12. A system for detecting the presence of a human hand on an opening element of a motor vehicle using a first ultra-high-frequency transceiver device installed in said opening element and a second ultra-high-frequency transceiver device for the purpose of activating a function of said vehicle, said system comprising:
a first ultra-high-frequency transceiver device configured so as to transmit a plurality of detection signals,
a second ultra-high-frequency transceiver device configured so as to receive a plurality of detection signals transmitted by the first ultra-high-frequency transceiver device, so as to measure the power of each received detection signal and so as to send the power values of the received detection signals to the first ultra-high-frequency transceiver device,
the first ultra-high-frequency transceiver device furthermore being configured so as to determine a power variation profile on the basis of power values received from the second ultra-high-frequency transceiver device and so as to detect the presence of a human hand on the opening element when the determined profile corresponds to a predetermined reference profile, said predetermined reference profile being characterized by an increase followed by a first decrease in the power value, characterizing the approach of a human hand, followed by a stagnation and a second decrease in the power value, characterizing contact of a human hand with the opening element of the vehicle.

* * * * *

UNITED STATES PATENT AND TRADEMARK OFFICE
CERTIFICATE OF CORRECTION

PATENT NO. : 10,889,266 B2
APPLICATION NO. : 16/482007
DATED : January 12, 2021
INVENTOR(S) : Sylvain Godet and Stéphane Billy Page 1 of 1

It is certified that error appears in the above-identified patent and that said Letters Patent is hereby corrected as shown below:

In the Claims

In Column 12, Line 12, Claim 3: "in that" should be deleted.

Signed and Sealed this
Sixth Day of April, 2021

Drew Hirshfeld
*Performing the Functions and Duties of the
Under Secretary of Commerce for Intellectual Property and
Director of the United States Patent and Trademark Office*